United States Patent
Tae

(10) Patent No.: US 9,601,524 B2
(45) Date of Patent: Mar. 21, 2017

(54) DISPLAY DEVICE AND METHOD OF MANUFACTURING THE SAME

(71) Applicant: Samsung Display Co., Ltd., Yongin, Gyeonggi-Do (KR)

(72) Inventor: Seunggyu Tae, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/788,408

(22) Filed: Jun. 30, 2015

(65) Prior Publication Data

US 2016/0126262 A1    May 5, 2016

(30) Foreign Application Priority Data

Oct. 31, 2014 (KR) ........................ 10-2014-0150634

(51) Int. Cl.
*H01L 27/12* (2006.01)
*H01L 27/32* (2006.01)

(52) U.S. Cl.
CPC ........ *H01L 27/1255* (2013.01); *H01L 27/124* (2013.01); *H01L 27/1248* (2013.01); *H01L 27/1259* (2013.01); *H01L 27/3265* (2013.01); *H01L 27/3258* (2013.01); *H01L 2227/323* (2013.01)

(58) Field of Classification Search
CPC ............. H01L 27/3262; H01L 27/3265; H01L 27/1255; H01L 29/788–29/7889; H01L 29/786; H01L 29/78603; H01L 29/78645; H01L 29/78651; H01L 29/78654; H01L 29/7866; H01L 29/78681; H01L 29/78684; H01L 29/7869; H01L 28/40; H01L 28/60
See application file for complete search history.

(56) References Cited

U.S. PATENT DOCUMENTS

| | | | | |
|---|---|---|---|---|
| 5,060,036 A * | 10/1991 | Choi | ................. | H01L 29/78687 257/350 |
| 5,693,552 A * | 12/1997 | Hsu | ..................... | H01L 27/1128 257/E21.677 |
| 6,512,504 B1 * | 1/2003 | Yamauchi | ........... | H01L 27/1251 257/E21.413 |
| 7,157,735 B2 * | 1/2007 | Fujikawa | .......... | G02F 1/136213 257/59 |
| 7,457,154 B2 * | 11/2008 | Yen | ..................... | G11C 11/5692 257/E27.102 |

(Continued)

FOREIGN PATENT DOCUMENTS

| | | |
|---|---|---|
| KR | 10-2007-0115370 A | 12/2007 |
| KR | 10-2013-0110987 A | 10/2013 |
| KR | 10-2014-0018623 A | 2/2014 |

*Primary Examiner* — Matthew Landau
*Assistant Examiner* — Grant Withers
(74) *Attorney, Agent, or Firm* — Knobbe Martens Olson & Bear LLP

(57) ABSTRACT

A display device is disclosed. In one aspect, the device includes a plurality of pixels. Each of the pixels includes a first thin-film transistor (TFT) formed over a substrate and comprising gate electrode, a source electrode, and a drain electrode. Each pixel also includes a storage capacitor formed over the substrate, wherein the storage capacitor includes first and second electrodes, and a dielectric layer interposed between the first and second electrodes. The first electrode, the dielectric layer, and the second electrode have substantially the same pattern.

10 Claims, 9 Drawing Sheets

(56) References Cited

U.S. PATENT DOCUMENTS

| | | | | |
|---|---|---|---|---|
| 7,557,373 B2* | 7/2009 | Kawamura | H01L 27/124 | 257/59 |
| 8,194,451 B2* | 6/2012 | Widjaja | G11C 11/404 | 365/185.05 |
| 8,643,013 B2 | 2/2014 | Zhan et al. | | |
| 9,184,417 B2* | 11/2015 | Oh | H01L 51/5228 | |
| 2002/0104995 A1* | 8/2002 | Yamazaki | H01L 27/3265 | 257/72 |
| 2004/0065902 A1* | 4/2004 | Yamazaki | H01L 27/1255 | 257/200 |
| 2005/0101062 A1* | 5/2005 | You | H01L 27/124 | 438/128 |
| 2008/0087942 A1* | 4/2008 | Hsu | H01L 27/115 | 257/324 |
| 2010/0193790 A1* | 8/2010 | Yeo | H01L 27/3248 | 257/59 |
| 2011/0108831 A1* | 5/2011 | Jeong | H01L 27/3248 | 257/43 |
| 2011/0215305 A1* | 9/2011 | Kim | H01L 51/52 | 257/40 |
| 2011/0297941 A1* | 12/2011 | Zhan | H01L 28/87 | 257/59 |
| 2012/0001191 A1* | 1/2012 | Ma | G02F 1/136213 | 257/71 |
| 2012/0068185 A1* | 3/2012 | Kim | H01L 27/3244 | 257/72 |
| 2012/0235147 A1* | 9/2012 | Park | H01L 27/1255 | 257/59 |
| 2012/0292645 A1* | 11/2012 | Park | H01L 27/1225 | 257/88 |
| 2012/0326156 A1* | 12/2012 | Choi | H01L 27/1259 | 257/71 |
| 2013/0001564 A1* | 1/2013 | Choi | H01L 27/3276 | 257/59 |
| 2013/0001577 A1* | 1/2013 | Kim | H01L 29/45 | 257/71 |
| 2013/0037818 A1* | 2/2013 | Lee | H01L 27/3258 | 257/72 |
| 2013/0071963 A1* | 3/2013 | Choi | H01L 29/78627 | 438/34 |
| 2013/0075766 A1* | 3/2013 | Chang | H01L 27/1255 | 257/88 |
| 2013/0134424 A1* | 5/2013 | Kim | H01L 27/124 | 257/59 |
| 2013/0207099 A1* | 8/2013 | Shu | H01L 27/3262 | 257/43 |
| 2013/0313529 A1* | 11/2013 | Kim | H01L 27/1255 | 257/40 |
| 2013/0334502 A1* | 12/2013 | Liu | H01L 27/3265 | 257/40 |
| 2014/0034923 A1* | 2/2014 | Kim | H01L 27/3297 | 257/40 |
| 2014/0183538 A1* | 7/2014 | Kim | H01L 27/1288 | 257/71 |
| 2014/0225075 A1* | 8/2014 | Zhan | H01L 29/78672 | 257/40 |
| 2014/0291635 A1* | 10/2014 | Cho | H01L 29/78618 | 257/40 |
| 2014/0326963 A1* | 11/2014 | Yang | H01L 51/56 | 257/40 |
| 2015/0097172 A1* | 4/2015 | Han | H01L 27/3262 | 257/40 |
| 2015/0123084 A1* | 5/2015 | Kim | H01L 27/326 | 257/40 |
| 2015/0144892 A1* | 5/2015 | Chang | H01L 27/3265 | 257/40 |
| 2015/0179724 A1* | 6/2015 | Lee | H01L 27/3241 | 257/40 |
| 2015/0187854 A1* | 7/2015 | Beak | H01L 27/3262 | 257/40 |
| 2015/0214248 A1* | 7/2015 | Chou | H01L 27/1225 | 257/40 |
| 2015/0243688 A1* | 8/2015 | Lee | H01L 29/7869 | 257/40 |
| 2015/0255490 A1* | 9/2015 | Miyairi | H01L 27/1207 | 257/43 |
| 2015/0255523 A1* | 9/2015 | Her | H01L 27/3258 | 345/76 |
| 2015/0263079 A1* | 9/2015 | Ko | H01L 27/3265 | 257/40 |
| 2015/0279916 A1* | 10/2015 | Takamaru | H01L 29/66969 | 257/40 |
| 2015/0287769 A1* | 10/2015 | Hsu | H01L 27/1218 | 257/40 |

* cited by examiner

DISPLAY DEVICE AND METHOD OF MANUFACTURING THE SAME

RELATED APPLICATION

This application claims the benefit of Korean Patent Application No. 10-2014-01506341, filed on Oct. 31, 2014, in the Korean Intellectual Property Office, the disclosure of which is incorporated herein in its entirety by reference.

BACKGROUND

Field

The described technology generally relates to a display device and a method of manufacturing the display device.

Description of the Related Technology

A liquid crystal display (LCD) operates based on the electric characteristic of a liquid crystal that is in an intermediate state between a liquid state and a solid state. The liquid crystal includes an array of liquid crystal particles of which orientation and optical characteristic such as birefringence, optical activity, and light scattering change in response to an external electric field applies thereto.

An organic light-emitting diode (OLED) display does not require a separate light source, can operate with a low voltage and has reduced weight and thickness. OLED technology has favorable characteristics such as wide viewing angle, high contrast, and fast response time. Accordingly, it is considered to be a next generation display technology.

An LCD device and an OLED display include various electrical lines and devices such as thin-film transistors (TFTs) and storage capacitors to perform various signal processing operations and display images in accordance to power supplied thereto. As the demand for high-definition displays has increased, more electrical lines and devices are used to achieve this purpose, which have a complicated structure.

SUMMARY OF CERTAIN INVENTIVE ASPECTS

One inventive aspect is a display device and a method of manufacturing the display device.

Another aspect is a display device that includes a plurality of pixels, each of the plurality of pixels including a first thin-film transistor (TFT) formed on a substrate and including a gate electrode, a source electrode, and a drain electrode; and a storage capacitor formed on the substrate and including a first electrode, a dielectric layer, and a second electrode that are sequentially stacked, wherein the first electrode, the dielectric layer, and the second electrode have a substantially same pattern.

The first electrode of the storage capacitor and the gate electrode may be formed on the same layer and formed of the same material.

Each of the plurality of pixels may further include an insulation pattern layer that has a substantially same pattern as and is formed on the gate electrode.

The insulation pattern layer and the dielectric layer may be formed on the same layer and formed of the same material.

Each of the plurality of pixels may further include a data line, and the second electrode of the storage capacitor may be formed above the gate electrode and below the data line.

Each of the plurality of pixels may further include an interlayer insulating layer formed between the second electrode of the storage capacitor and the data line.

Each of the plurality of pixels may further include a second TFT formed on the substrate, and the first electrode of the storage capacitor may cover an active layer of the second TFT.

The first electrode of the storage capacitor may function as a gate electrode of the second TFT.

The first electrode and the second electrode of the storage capacitor may include materials having different etch selectivities.

Another aspect is a method of manufacturing a display device that includes operations of sequentially forming a first conductive layer, an insulating layer, and a second conductive layer on a substrate; forming a first photoresist pattern on the second conductive layer; and simultaneously patterning the first conductive layer, the insulating layer, and the second conductive layer by using the first photoresist pattern as a mask, thereby forming a storage capacitor including a first electrode, a dielectric layer, and a second electrode that have a substantially same pattern.

The method may further include operations of forming a second photoresist pattern on the second conductive layer; patterning the first conductive layer, the insulating layer, and the second conductive layer by using the second photoresist pattern as a mask, thereby forming pattern layers that include a first conductive pattern layer, an insulation pattern layer, and a second conductive pattern layer; removing the second photoresist pattern; and removing the second conductive pattern layer.

The operation of forming the first photoresist pattern and the operation of forming the second photoresist pattern may be performed in the same mask process.

The first conductive pattern layer may function as a gate electrode of a thin-film transistor (TFT).

The operation of forming the pattern layers and the operation of forming the storage capacitor may be performed in the same etching process.

In the operation of removing the second conductive pattern layer, the first photoresist pattern may remain on the second electrode.

The first electrode may include a material having an etch selectivity different from that of the second electrode, and the first conductive pattern layer may include a material having an etch selectivity different from that of the second conductive pattern layer.

The method may further include an operation of forming active layers on the substrate, and the first electrode may be formed to overlap an active layer from among the active layers.

Another aspect is a display device comprising a plurality of pixels, each of the pixels comprising: a first thin-film transistor (TFT) formed over a substrate and comprising a gate electrode, a source electrode, and a drain electrode; and a storage capacitor formed over the substrate, wherein the storage capacitor includes first and second electrodes, and a dielectric layer interposed between the first and second electrodes, wherein the first electrode, the dielectric layer, and the second electrode have substantially the same etching pattern.

In the above display device, the first and second electrodes, and the dielectric layer are configured to be substantially simultaneously formed by the same mask. In the above display device, the first electrode of the storage capacitor and the gate electrode are formed on the same layer and formed of the same material. In the above display device, each of the pixels further comprises an insulation pattern layer that has substantially the same etching pattern as and is formed on the gate electrode. In the above display device, the insulation pattern layer and the dielectric layer are formed on the same layer and formed of the same material. In the above display device, each of the pixels further comprises a data line, and wherein the second electrode of the storage capacitor is formed above the gate electrode and below the data line.

In the above display device, wherein each of the pixels further comprises an interlayer insulating layer formed between the second electrode of the storage capacitor and the data line. In the above display device, each of the pixels further comprises a second TFT formed over the substrate, and wherein the first electrode of the storage capacitor at least partially covers an active layer of the second TFT. In the above display device, the first electrode of the storage capacitor is configured to function as a gate electrode of the second TFT. In the above display device, the first and second electrodes of the storage capacitor comprise materials having different etch selectivities. In the above display device, the first electrode, the dielectric layer, and the second electrode have substantially the same width.

Another aspect is a method of manufacturing a display device, the method comprising: sequentially forming a first conductive layer, an insulating layer, and a second conductive layer over a substrate; forming a first photoresist pattern over the second conductive layer; and substantially simultaneously patterning the first conductive layer, the insulating layer, and the second conductive layer with the use of the first photoresist pattern as a mask, so as to form a storage capacitor, wherein the storage capacitor comprises a first electrode, a dielectric layer, and a second electrode that have substantially the same etching pattern.

The above method further comprises: forming a second photoresist pattern over the second conductive layer; patterning the first conductive layer, the insulating layer, and the second conductive layer with the use of the second photoresist pattern as a mask, so as to form a plurality of pattern layers, wherein the pattern layers include a first conductive pattern layer, an insulation pattern layer, and a second conductive pattern layer; removing the second photoresist pattern, and removing the second conductive pattern layer. In the above method, the first photoresist pattern and the second photoresist pattern are formed by the same mask process. In the above method, the first conductive pattern layer is configured to function as a gate electrode of a thin-film transistor (TFT).

In the above method, the pattern layers and the storage capacitor are formed by the same etching process. In the above method, the removing of the second conductive pattern layer comprises maintaining the first photoresist pattern on the second electrode. In the above method, the first electrode comprises a material having an etch selectivity different from that of the second electrode, and wherein the first conductive pattern layer comprises a material having an etch selectivity different from that of the second conductive pattern layer. The above method further comprises forming a plurality of active layers over the substrate, and wherein the first electrode at least partially overlaps a selected one of the active layers. In the above method, the first electrode, the dielectric layer, and the second electrode have substantially the same width.

DETAILED DESCRIPTION OF CERTAIN INVENTIVE EMBODIMENTS

Figure 1:
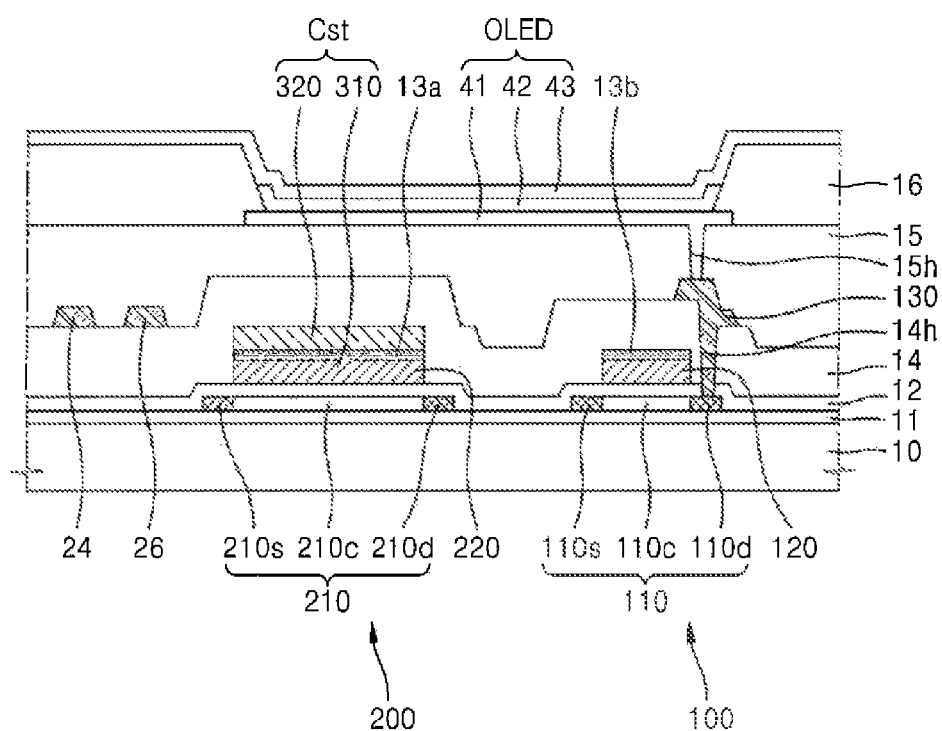
FIG. 1 is a cross-sectional view of a display device according to an exemplary embodiment.

Embodiments will be described with reference to the accompanying drawings. The described technology may, however, be embodied in many different forms and should not be construed as being limited to the embodiments set forth herein.

Those components that are the same or are in correspondence are rendered the same reference numeral regardless of the figure number and redundant explanations are omitted.

Throughout the specification, while such terms as "first," "second," etc., may be used to describe various components, such components must not be limited to the above terms. The above terms are used only to distinguish one component from another.

Throughout the specification, a singular form may include plural forms, unless there is a particular description contrary thereto.

It will be understood that when a layer, an area, a component, or the like is referred to as being "on" another layer, area, or component can be directly on another layer, area, or component or intervening layer, area, or component may also be present.

In the drawings, the thicknesses of layers and regions are exaggerated for clarity. For example, the thicknesses and sizes of elements in the drawings are arbitrarily shown for convenience of description, thus, the spirit and scope of the described technology are not necessarily defined by the drawings.

Also, it should also be noted that in some alternative implementations, the steps of all methods described herein may occur out of the order. For example, two steps illustrated in succession may in fact be executed substantially concurrently or the two steps may sometimes be executed in the reverse order.

As used herein, the term "and/or" includes any and all combinations of one or more of the associated listed items.

In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a cross-sectional view of a display device according to an exemplary embodiment.

Referring to FIG. 1, the display device includes a of thin-film transistors (TFTs) 100 and 200, a storage capacitor Cst, a plurality of lines, and a display device that are formed on a substrate 10.

The substrate 10 may be formed of a glass material, a metal material, or a plastic material. The plastic material may include various materials such as polyethylen terephthalate (PET), polyethylen naphthalate (PEN), polyimide, or the like.

A buffer layer 11 forms a planar surface on the substrate 10 and prevents penetration of foreign substances. The buffer layer 11 may be a single layer or multiple layers formed of an inorganic material such as silicon nitride (SiNx) and/or silicon oxide (SiOx).

The TFTs 100 and 200 and the storage capacitor Cst are formed on the substrate 10 and are electrically connected to the lines. The lines may include a scan line (not shown), an emission control line (not shown), a data line 26, an initialization voltage line (not shown), and a driving voltage line 24. Throughout the specification when elements are electrically connected, the elements may be directly connected to each other or an intervening element(s) may be interposed between the elements.

The TFTs 100 and 200 may include a plurality of switching TFTs and a driving 200. FIG. 1 illustrates an emission control TFT 100 that is one of the switching TFTs.

In some embodiments, the emission control TFT 100 is turned on in response to an emission control signal from the emission control line, and makes a first power voltage applied to a pixel electrode 41 of the display device, e.g., an organic light-emitting device OLED.

The emission control TFT 100 includes an emission control active layer 110, an emission control gate electrode 120, an emission control source electrode 110s, and an emission control drain electrode 110d.

The emission control gate electrode 120 corresponds to a portion of the emission control line, and the emission control source electrode 110s and the emission control drain electrode 110d correspond respectively to an emission control source region and an emission control drain region that are formed in a manner that an active layer formed as a polysilicon layer is doped with an n-type or p-type impurity.

In the present embodiment, the emission control active layer 110 is formed as the polysilicon layer but the described technology is not limited thereto. In another embodiment, the emission control active layer 110 may be formed of amorphous silicon or an oxide semiconductor such as a G-I-Z-O layer [$(In_2O_3)a(Ga_2O_3)b(ZnO)c$ layer] (where, a, b, are real numbers that satisfy a≥0, b≥0, c>0, respectively).

The emission control drain electrode 110d may be connected to a cover metal 130 through a contact hole 14h and may be connected to the pixel electrode 41 of the display device, e.g., the OLED through the cover metal 130. The pixel electrode 41 is connected to the cover metal 130 through a via hole 15h formed in a planarization layer 15. A pixel-defining layer 16 having an opening for exposing a top surface of the pixel electrode 41 is formed on the pixel electrode 41, an intermediate layer 42 including an emission layer is formed in the opening of the pixel-defining layer 16, and an opposite electrode 43 is formed on the intermediate layer 42.

The driving TFT 200 may be electrically connected to the pixel electrode 41 of the display device, e.g., the OLED through the emission control TFT 100. The driving TFT 200 supplies a driving current to the organic light-emitting device OLED, based on a data signal that is transmitted from the data line 25 according to a switching operation of another switching TFT (not shown).

The driving TFT 200 includes a driving active layer 210, a driving gate electrode 220, a driving source electrode 210s, and a driving drain electrode 210d. The driving source electrode 210s and the driving drain electrode 210d correspond respectively to a driving source region and a driving drain region that are formed in a manner that an active layer formed as a polysilicon layer is doped with an n-type or p-type impurity.

In the present embodiment, the driving active layer 210 is formed as the polysilicon layer but the described technology is not limited thereto. In another embodiment, the driving active layer 210 may be formed of amorphous silicon or an oxide semiconductor such as a G-I-Z-O layer [$(In_2O_3)a(Ga_2O_3)b(ZnO)c$ layer] (where, a, b, c are real numbers that satisfy a≥0, b≥0, c>0, respectively).

The storage capacitor Cst may at least partially overlap the driving TFT 200 by having agate insulating layer 12 interposed therebetween, and thus may increase a use efficiency of a space below the organic light-emitting device OLED. The gate insulating layer 12 may be formed of an inorganic material 12 such $SiO_2$, SiNx, SiON, $Al_2O_3$, $TiO_2$, $Ta_2O_5$, $HfO_2$, $ZrO_2$, BST, or PZT.

The storage capacitor Cat includes a first electrode 310, a dielectric layer 13a, and a second electrode 320 that are sequentially stacked. The first electrode 310, the dielectric layer 13a, and the second electrode 320 of the storage capacitor Cst can have substantially the same pattern or the same etching pattern. For example, the first and second electrodes 310 and 320, and the dielectric layer 13a can be substantially simultaneously formed by the same mask. The first electrode 310, the dielectric layer 13a, and the second electrode 320 of the storage capacitor Cst may be simultaneously patterned in the same mask process and thus may have the materially same pattern.

The first electrode 310 of the storage capacitor Cst may also function as the gate electrode 220 of the driving TFT 200 and may be formed on the same layer and formed of the same material as a switching gate electrode, e.g., the emission control gate electrode 120. The first electrode 310 of the storage capacitor Cst may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W) and copper (Cu).

The dielectric layer 13a of the storage capacitor Cst may be formed of an inorganic material such as $SiO_2$, SiNx, SiON, $Al_2O_3$, $TiO_2$, $Ta_2O_5$, $HfO_2$, $ZrO_2$, BST, or PZT. The dielectric layer 13a may be formed on the same layer as an insulation pattern layer 13b formed on the emission control gate electrode 120, and formed of the same material as an insulation pattern layer 13b formed on the emission control gate electrode 120. The insulation pattern layer 13b may be formed when the emission control gate electrode 120 is patterned and may have substantially the same pattern as the emission control gate electrode 120.

The second electrode 320 of the storage capacitor Cst may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu).

In an embodiment, the second electrode 320 of the storage capacitor Cst may include a material having a different etch selectivity from the first electrode 310 of the second electrode 320. When the storage capacitor Cst is formed, a switching TFT, e.g., the emission control gate electrode 120 of the emission control TFT 100 may also be formed.

In this process, an etching process is performed to remove a conductive pattern layer M2' (refer to FIG. 3B) formed on the emission control gate electrode 120 of the emission control TFT 100, and here, in order to prevent the first electrode 310 and the emission control gate electrode 120 of the storage capacitor Cst from being over-etched in a side direction, the second electrode 320 of the storage capacitor Cst may include an material having a different etch selectivity from the first electrode 310 and the emission control gate electrode 120 of time second electrode 320. For example, if the first electrode 310 includes molybdenum (Mo), the second electrode 320 may include titanium (Ti), chrome (Cr), or ITO.

The second electrode 320 of the storage capacitor Cst is formed lower than the data line 26 and the driving voltage line 24. If the second electrode 320 of the storage capacitor Cst is formed at the same layer as the data line 26 and the driving voltage line 24, an interlayer insulating layer 14 is interposed between the first electrode 310 and the second electrode 320 of the storage capacitor Cst. In order to insulate a plurality of TFTs from lines, the interlayer insulating layer 14 has a thickness of at least about 4000 Å. Since the interlayer insulating layer 14 has the relatively large thickness, the first and second electrodes 310 and 320 having the interlayer insulating layer 14 interposed between may not assure sufficient capacitance.

However, in the present embodiment, the second electrode 320 of the storage capacitor Cst is formed lower than the data line 26 and the driving voltage line 24, and thus a distance between the first electrode 310 and the second electrode 320 is decreased, so that capacitance may be sufficiently assured. Also, since the first electrode 310, the dielectric layer 13a, and the second electrode 320 of the storage capacitor Cst are patterned in the same process, it is possible to form the storage capacitor Cst having sufficient capacitance, without adding a mask process. A method of manufacturing the storage capacitor Cst is described below with reference to FIGS. 2 through 7.

FIGS. 2 through 7 are cross-sectional views illustrating a method of manufacturing the display device, according to an exemplary embodiment.

Figure 2:
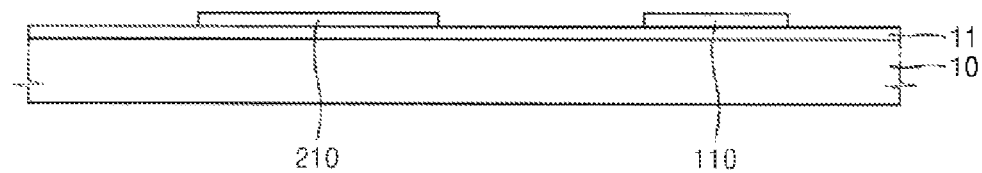
FIGS. 2 through 7 are cross-sectional views for illustrating a method of manufacturing the display device, according to an exemplary embodiment.

FIG. 2 illustrates a first mask process. The substrate 10 may be formed of a glass material, a metal material, or a plastic material. The plastic material may include various materials such as polyethylen terephthalate (PET), polyethylen naphthalate (PEN), polyimide, or the like. The buffer layer 11 maybe a single layer or multiple layers formed of an inorganic material such as silicon nitride (SiNx) and/or silicon oxide (SiOx).

A semiconductor layer may include a polysilicon layer, an amorphous silicon layer, or an oxide semiconductor such as a G-I-Z-O layer [$(In_2O_3)a(Ga_2O_3)b(ZnO)c$ layer] (where, a, b, c are real numbers that satisfy a≥0, b≥0, c>0, respectively).

Figure 3A:
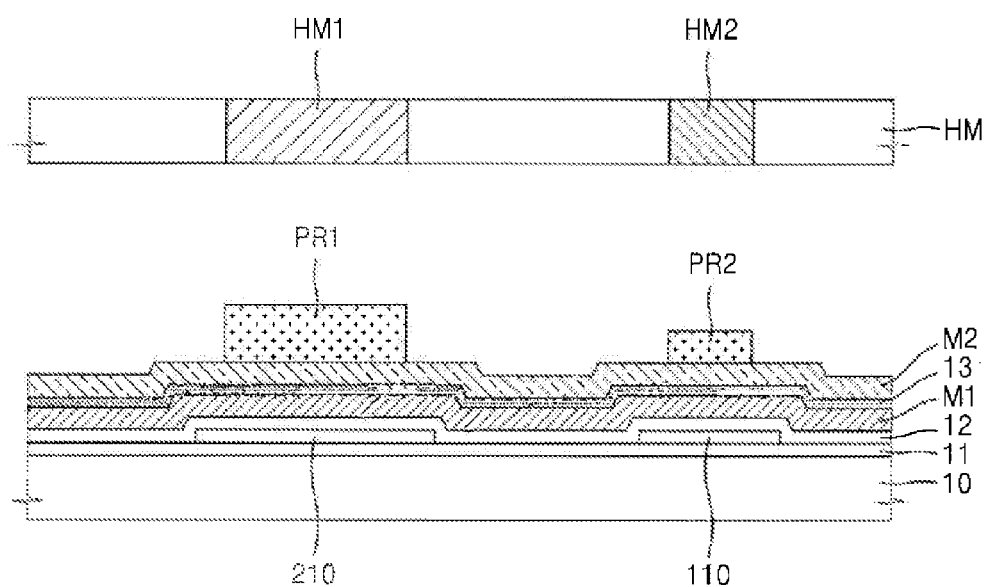
Figure 3B:
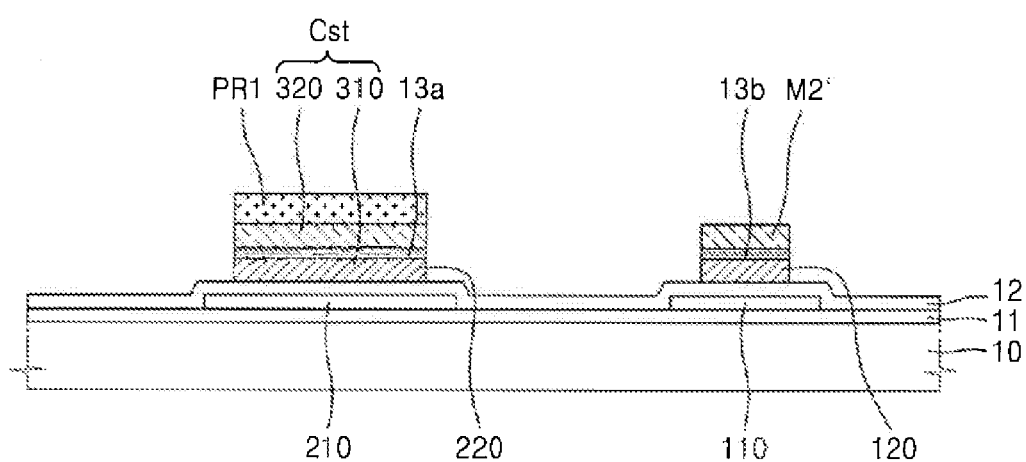
Figure 3C:
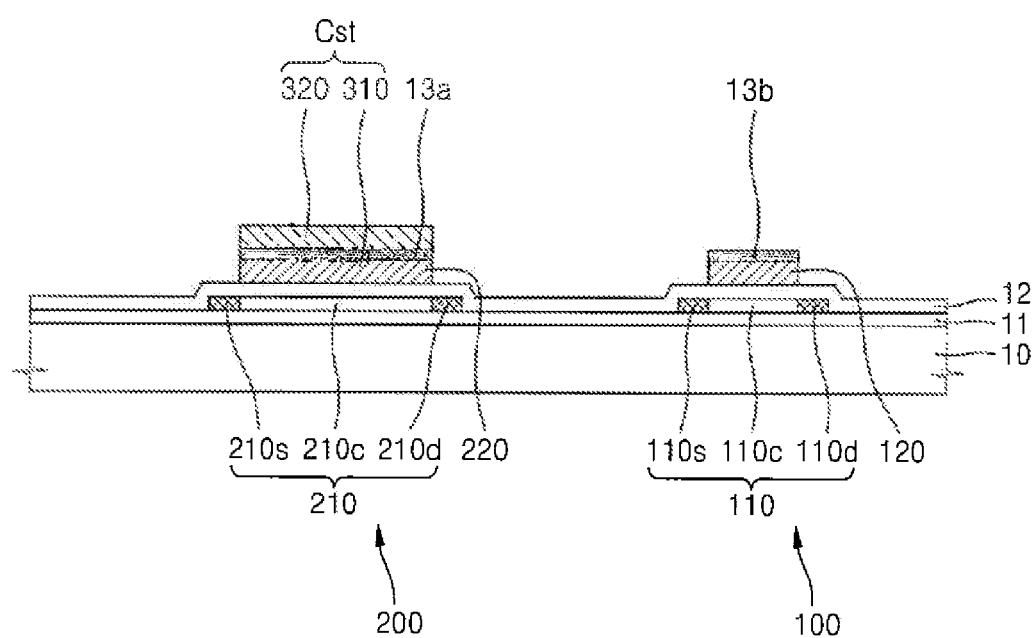

FIGS. 3A through 3C illustrate a second mask process. Referring to FIG. 3A, a first conductive layer M1, an insulating layer 13, and a second conductive layer M2 are formed on the substrate 10 on which the active layers 110 and 210 are formed.

The first conductive layer M1 may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu).

The insulating layer 13 may be farmed of an inorganic material such as $SiO_2$, SiNx, SiON, $Al_2O_3$, $TiO_2$, $Ta_2O_5$, $HfO_2$, $ZrO_2$, BST, or PZT.

The second conductive layer M2 may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu).

Afterward, a first photoresist pattern PR1 and a second photoresist pattern PR2 are formed by using a halftone mask HM.

A photoresist, e.g., a negative photoresist is formed on the second conductive layer M2, and light is irradiated thereon by using the halftone mask HM. A transmitting part HM1 of the halftone mask HM corresponds to a region that becomes the storage capacitor Cst, so that the first photoresist pattern PR1 having a high step is formed therein, and a half-transmitting part H2 corresponds to a region that becomes a switching TFT, e.g., the emission control gate electrode 120 of the emission control TFT 100, so that the second photoresist pattern PR2 having a relatively low step is formed therein.

In the present embodiment, the second mask process is performed by using the negative photoresist as the photoresist, but in another embodiment, the second mask process may be performed by using a positive photoresist as the photoresist.

Next, the first conductive layer M1, the insulating layer 13, and the second conductive layer M2 are patterned by using the first photoresist pattern PR1 and the second photoresist pattern PR2 as a mask (first etching). The patterning operation may be performed by using a dry etching method or a wet etching method. As a result of the patterning operation, the storage capacitor Cst that includes the first electrode 310, the dielectric layer 13a, and the second electrode 320 are formed on the driving active layer 210, and a first conductive pattern layer 120, the insulation pattern layer 13b, and a second conductive pattern layer M2' are formed on a switching active layer, e.g., the emission control active layer 110. The first conductive pattern layer 120 becomes the emission control gate electrode 120.

Referring to FIG. 3B, an ashing process is performed on the first and second photoresist patterns PR1 and PR2. Through the ashing process, the second photoresist pattern PR2 having the low step is removed, so that the second conductive pattern layer M2' is exposed. On the other hand, the first photoresist pattern PR1 having the high step remains.

Referring to FIG. 3C, the second conductive pattern layer M2' that is exposed through an etching process is removed (second etching), and the remaining first photoresist pattern PR1 is removed. The etching process may be performed by using a dry etching method or a wet etching method.

If the first and second conductive layers M1 and M2 include the same material, the first electrode 310 and the first conductive pattern layer 120 of the storage capacitor Cst that are formed of the first conductive layer M1 may be over-etched in a side direction in the etching process of removing the second conductive pattern layer M2'. In order to prevent the phenomenon, in some embodiments, a material included in the second conductive pattern layer M2', i.e., material of the second conductive layer M2 and a material of the first conductive layer M1 may have different etch selectivities. For example, if the first conductive layer M1 includes the molybdenum (Mo), the second conductive layer M2 may include titanium (Ti), chronic (Cr), or ITO.

Figure 4:
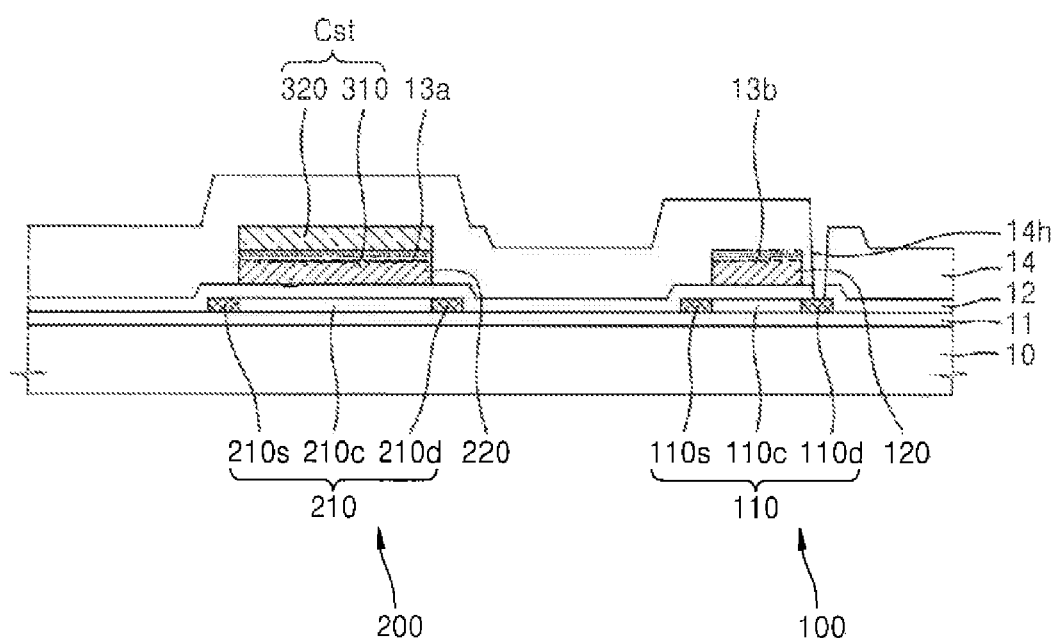

FIG. 4 illustrates a third mask process. Referring to FIG. 4, the interlayer insulating layer 14 having a contact hole 14h is formed. The interlayer insulating layer 14 may be a single layer or multiple layers formed of an inorganic material such as SiO2, SiNx, SiON, Al2O3, TiO2, Ta2O5, HfO2, ZrO2, BST, or PZT.

Figure 5:
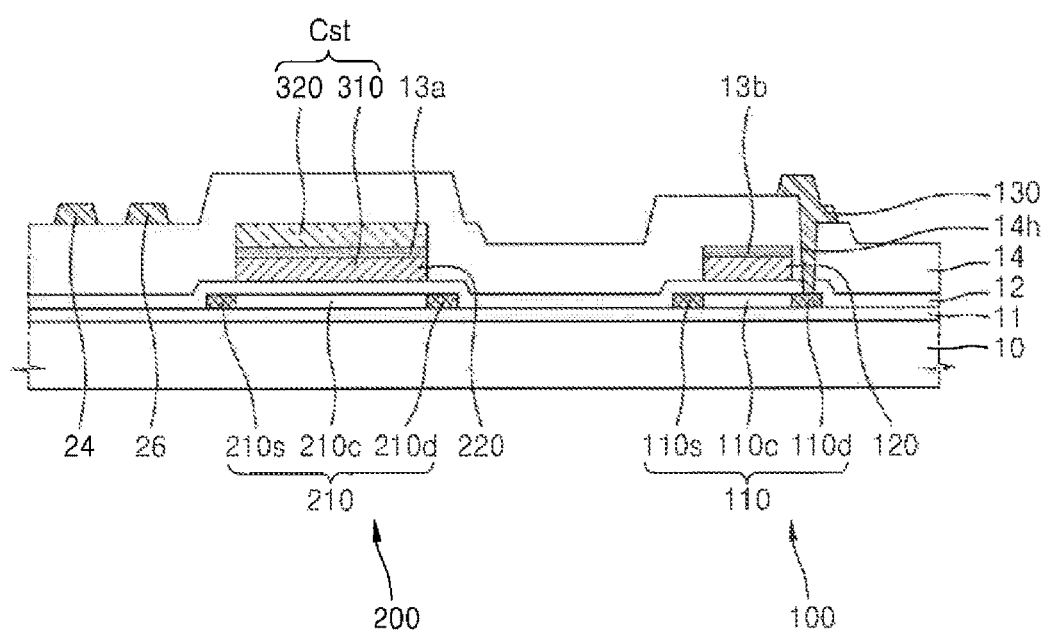

FIG. 5 illustrates a fourth mask process. Referring to FIG. 5, a metal layer (not shown) is formed and is patterned, so that the cover metal 130, the data line 26, and the driving voltage line 24 may be formed.

The metal layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu).

Figure 6:
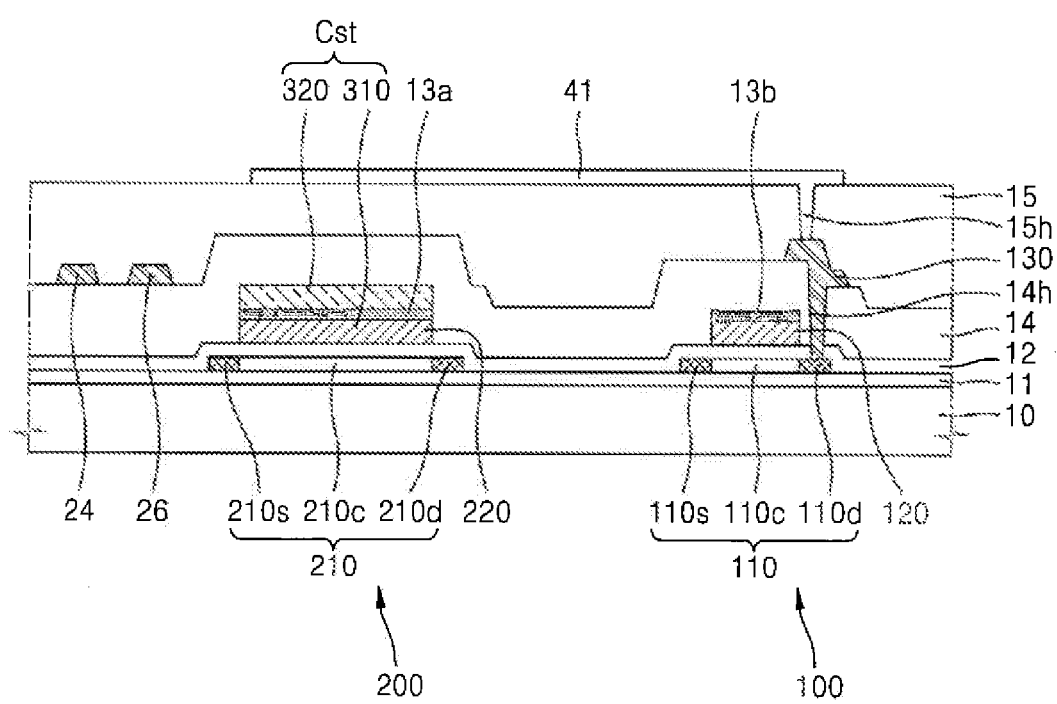

FIG. 6 illustrates a fifth mask process and a sixth mask process. Referring to FIG. 6, the planarization layer 15 having a via hole 15h is formed (the fifth mask process) and then the pixel electrode 41 is formed (the sixth mask process).

The planarization layer 15 may be formed of an inorganic insulating material or/and an organic insulating material. The pixel electrode 41 may be electrically connected to the switching TFT, e.g., the emission control drain electrode 110d of the emission control TFT 100.

Figure 7:
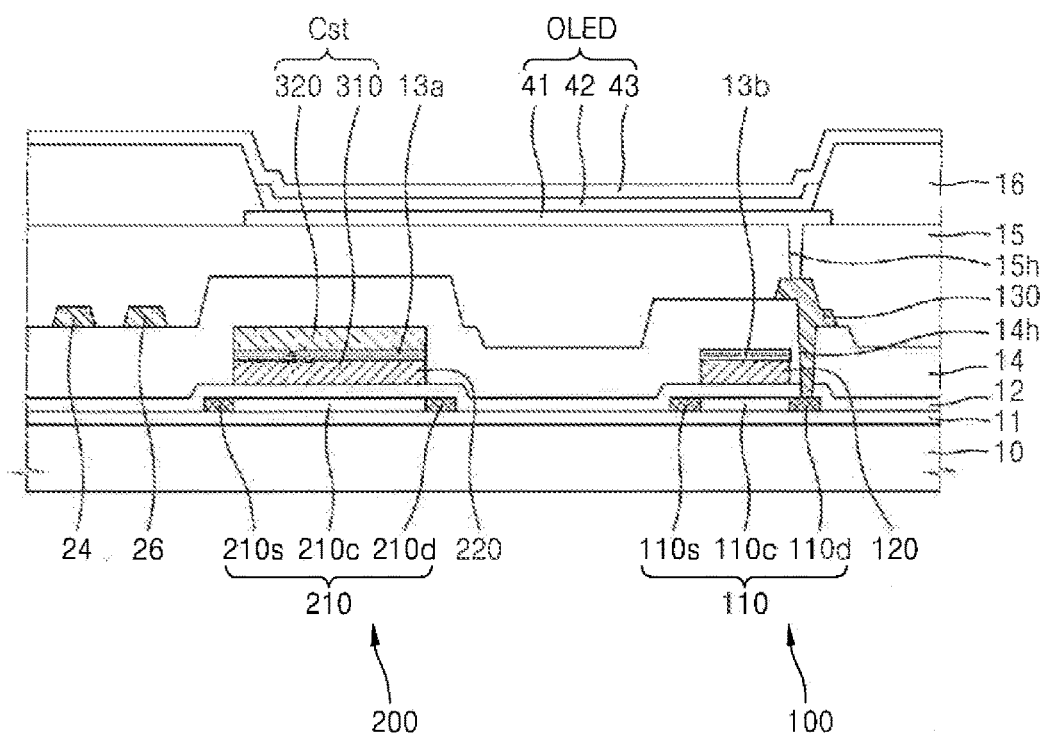

FIG. 7 illustrates a seventh mask process. Referring to FIG. 7, the pixel-defining layer 16 having an opening for exposing a top surface of the pixel electrode 41 is formed (the seventh mask process). The pixel-defining layer 16 may be formed of at least one organic material selected from the group consisting of polyimide, polyamide, an acryl resin, benzocyclobutene, and a phenol resin.

Afterward, the intermediate layer 42 including an emission layer may be formed in the opening of the pixel-defining layer 16, and the opposite electrode 43 that covers the intermediate layer 42 and the pixel-defining layer 16 may be formed on the intermediate layer 42. The emission layer may include a small molecule organic material and/or a polymer organic material of emitting red green light, blue light, or white light. In addition to the emission layer, the intermediate layer 42 may further include at least one selected from a hole injection layer (HIL), a hole transport layer (HTL), an electron transport layer (ETL), and an electron injection layer (EIL). In another embodiment, the intermediate layer 42 may further include various functional layers.

In the present embodiment, the intermediate layer 42 including the emission layer formed of an organic material is interposed between the pixel electrode 41 and the opposite electrode 43, but the described technology is not limited thereto. In another embodiment, a liquid crystal layer may be interposed between the pixel electrode 41 and the opposite electrode 43 such that the display device may be a liquid crystal display device.

As described above, according to the display device and method of manufacturing the display device according to at least one of the disclosed embodiments, the display device may have the storage capacitor capable of assuring sufficient capacitance without an additional mask process.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A display device comprising a plurality of pixels, each of the pixels comprising:
   a first thin-film transistor (TFT) formed over a substrate and comprising a gate electrode, a source electrode, and a drain electrode, wherein the TFT further comprises an active layer including a source region, a drain region, and a channel region between the source region and the drain region; and
   a storage capacitor formed over the substrate, wherein the storage capacitor includes a first electrode, a second electrode over the first electrode, and a dielectric layer interposed between the first and second electrodes, wherein the storage capacitor is formed over and overlaps the active layer of the first TFT in the depth dimension of the display device, wherein the gate electrode of the first TFT and the first electrode of the storage capacitor are formed of the same conductive layer,
   wherein the first electrode, the dielectric layer, and the second electrode have sidewalls being vertically aligned to each other, and
   wherein the second electrode entirely covers the channel region in a cross-sectional cutout view.

2. The display device of claim 1, wherein the first electrode of the storage capacitor and the gate electrode are formed on the same layer and formed of the same material.

3. The display device of claim 1, wherein each of the pixels further comprises a data line, and wherein the second electrode of the storage capacitor is formed above the gate electrode and below the data line.

4. The display device of claim 3, wherein each of the pixels further comprises an interlayer insulating layer formed between the second electrode of the storage capacitor and the data line.

5. The display device of claim 1, wherein each of the pixels further comprises a second TFT formed over the substrate.

6. The display device of claim 5, wherein each of the pixels further comprises an insulation pattern layer that is formed on the gate electrode of the second TFT.

7. The display device of claim 6, wherein the insulation pattern layer and the dielectric layer are formed of the same material.

8. The display device of claim 1, wherein the first and second electrodes of the storage capacitor comprise materials that have different etch selectivities.

9. The display device of claim 1, wherein the first electrode, the dielectric layer, and the second electrode have substantially the same width.

10. The display device of claim 1, wherein the first electrode of the storage capacitor has top and bottom surfaces opposing each other, wherein the bottom surface faces the substrate, wherein the gate electrode has top and bottom surfaces opposing each other, wherein the bottom surface of the gate electrode faces the substrate, and wherein the distance between the bottom surface of the first electrode of the storage capacitor and the substrate is the same as the distance between the bottom surface of the gate electrode and the substrate.

* * * * *